United States Patent [19]

Binet et al.

[11] Patent Number: 4,656,371
[45] Date of Patent: Apr. 7, 1987

[54] CLOCKED COMPARATOR

[75] Inventors: Michel J. M. Binet, Creteil; Thierry Ducourant, Crosne, both of France

[73] Assignee: U.S. Philips Corporation, New York, N.Y.

[21] Appl. No.: 793,606

[22] Filed: Oct. 31, 1985

[30] Foreign Application Priority Data

Nov. 9, 1984 [FR] France .................. 84 17095

[51] Int. Cl.⁴ .................. H03K 5/153; H03K 5/24; H03M 1/36
[52] U.S. Cl. .................. 307/362; 307/530; 307/272 A; 307/279; 307/261
[58] Field of Search ............. 307/350, 355, 362, 530, 307/272 A, 291, 279, 261; 340/347 AD, 347 M

[56] References Cited

U.S. PATENT DOCUMENTS 4,539,551  9/1985  Fujita et al. .................. 307/362

Primary Examiner—John Zazworsky
Attorney, Agent, or Firm—Robert T. Mayer; Bernard Franzblau

[57] ABSTRACT

A clocked comparator comprising a comparison stage (1) for comparing an analog input voltage $V_{IN}$ with an analog reference voltage $V_{REF}$ and supplying an intermediate signal $V_M$ and its complement $\overline{V_M}$, an amplifier stage ((2) for amplifying the logic states of the intermediate signal, a first latching stage (3) and a second latching stage (4) coupled to the comparison stage and to the amplifier stage respectively, for generating and storing the logic states determined by the signals from the comparison and amplifier stages. A second comparison stage (5) is coupled in parallel with the first comparison stage to compensate for hysteresis in said first comparison stage. A second amplifier stage (6) is coupled in parallel with the first amplifier stage to eliminate phase indeterminacy of the logic states of the intermediate signal. The second latching stage and the first latching stage are alternately enabled by a first clock signal C and its complement $\overline{C}$. The first amplifier stage and the second amplifier stage are enabled alternately by a second clock signal H and its complement $\overline{H}$. The amplifier stages operate in phase with the comparison stages and the first latching stage.

Use: An analog-to-digital converter constructed by means of depletion-type gallium-arsenide field-effect transistors.

9 Claims, 4 Drawing Figures

CLOCKED COMPARATOR

The invention relates to a clocked voltage comparator formed by means of transistors which each have a control electrode, a first main electrode and a second main electrode, which comparator comprises:

a comparison stage for comparing an analog input voltage with an analog reference voltage and applying the result of this comparison in the form of an intermediate signal and its complement, which stage comprises two transistors arranged as a first differential pair, the input voltage and the reference voltage being applied to the respective control electrodes of said transistors whose first main electrodes are connected to a common terminal for applying a bias current and whose second main electrodes are each coupled to a first d.c. supply terminal via a load and supply the intermediate signal and its complement respectively;

an amplifier stage for amplifying the logic states of the intermediate signal, which stage comprises two transistors arranged as a second differential pair, whose respective control electrodes receive said intermediate signal and its complement, whose first main electrodes serve to receive a bias current and whose second main electrodes are each coupled to the first d.c. supply terminal via a load and supply the digital output signal of the comparator and its complement;

a first latching stage and a second latching stage coupled to the comparison stage and the amplifier stage respectively, for generating and latching logic states in conformity with the output signals from the comparison stage and the amplifier stage, which first latching stage comprises two transistors arranged as a third differential pair forming a bistable latch, the intermediate signal and its complement being applied to the respective control electrodes of said first latching-stage transistors, whose first main electrodes are connected to a common terminal for applying a bias current and whose second main electrodes are cross-coupled to the second main electrodes of the transistors of the comparison stage, and which second latching stage comprises two transistors arranged as a fourth differential pair forming a bistable latch, the digital output signal and its complement being applied to the respective control electrodes of said second latching-stage transistors, whose first main electrodes are connected to a common terminal for applying a bias current and whose second main electrodes are cross-coupled to the second main electrodes of the transistors of the amplifier stage.

Such a circuit may be used, for example, in an analog-to-digital converter of the parallel type in which the analog input signal is applied to the inputs of a plurality of parallel comparator circuits to form a digital output signal, in which comparator circuits this input voltage is compared with a reference voltage which differs for each comparator circuit. The output signals of the comparator circuits are converted into a digital output signal by means of a decoding device. The clocked comparator employed in such a parallel analog-to-digital converter is generally of a type as defined in the above paragraph.

Such a circuit is disclosed in inter alia U.S. Pat. No. 4,121,120. This known circuit, which is equipped with bipolar transistors, comprises a comparison stage formed by a first pair of emitted-coupled transistors whose bases receive the input signals. This circuit also comprises an amplifier stage formed by a second pair of emitter-coupled transistors whose bases receive the signals from the collectors of the transistors of the comparison stage. Finally this circuit comprises two latching stages which respectively comprise a third and a fourth pair of emitter-coupled transistors, whose collectors are cross-coupled to the collectors of the first transistor pair and to the collectors of the second transistor pair respectively. Moreover, the emitters of these first, second, third and fourth transistor pairs are each coupled to a current source via a transistor switch, the switches of the comparison stage and of the first latching stage having their commoned emitters coupled to a first current source and the switches of the amplifier stage and the second latching stage having their commoned emitters coupled to a second current source. These switches are controlled by clock signals in such a way that the comparison stage and the second latching stage are operated simultaneously, i.e. exactly when the amplifier stage and the first latching stage are inoperative. On the output of the first latching stage this known circuit produces an intermediate signal whose logic states follow the sign of the difference between the input signal and the reference signal applied to the inputs of the comparison stage, which difference is sampled on a rising edge of the clock signal. On the output of the comparator the amplifier stage supplies an amplified digital signal whose logic states follow the states of the intermediate signal, which are sampled on a rising edge of the clock signal, and which are latched by the second latching stage until another state appears on a rising edge.

In order to realise novel logic systems with a higher information-processing capacity, such circuits should be constructed by means of new technologies such as, for example, a technology using gallium-arsenide field-effect transistors.

If, for example, a gallium-arsenide depletion-type field-effect transistor is selected as the active element in a clocked comparator, a very high operating speed can be obtained without a consequent increase in power consumption.

However, such a transistor exhibits hysteresis

This effect manifests itself as follows. If a gate voltage is applied to a transistor and the drain voltage is made to vary between two values, it is found that the current transients are not rectangular (when the modulation is rectangular), resulting in time constants of the order of 100 milliseconds and more.

In the comparator this gives rise to hysteresis. If in the case of a fixed d.c. reference voltage the input voltage is increased progressively, a change-over will occur when the input voltage exceeds the reference voltage. However, if the input voltage is decreased the change-over will occur at a voltage lower than the reference voltage.

Therefore, it is an object of the present invention to provide a clocked comparator which can be realised in a technology employing depletion-type gallium-arsenide transistors, but whose special circuit arrangement ensures that the effects caused by hysteresis of the transistors are eliminated without phase-indeterminacy errors being introduced.

According to the invention this object is achieved in a comparator as defined in the opening paragraph, which is characterized in that it also comprises:

a second comparison stage adapted to provide compensation for the hysteresis of the first comparison stage, which second comparison stage comprises two transistors arranged as a fifth differential pair, the input voltage and the reference voltage being applied to the respective control electrodes of said transistors, whose first main electrodes are connected to a common terminal for applying a bias voltage and whose second main electrodes are cross-coupled to the second main electrodes of the transistors of the first comparison stage, a second amplifier stage adapted to eliminate the phase indeterminacy of the logic states of the intermediate signal, which second amplifier stage comprises two transistors arranged as a sixth differential pair, the intermediate signal and its complement being applied to the respective control electrodes of said transistors, whose first main electrodes serve for applying a bias current and whose second main electrodes are cross-coupled to the second main electrodes of the transistors of the first amplifier stage, in that the bias currents for the first differential pair and the fifth differential pair are such that the first comparison stage and the second comparison stage operate alternately, in that the bias currents for the second differential pair and the sixth differential pair are such that the first amplifier stage and the second amplifier stages operate alternately, in that the bias currents for the third differential pair and the fourth differential pair are such that the first latching stage and the second latching stage operate alternately, and in that the bias currents for the amplifier stages are such that said amplifier stages operate in phase with the comparison stages and with the first latching stage.

Since the two comparison stages are alternately put into operation, the hysteresis caused by a single comparison stage is thus compensated for. Further, since the amplifier stages are operated in phase with the comparison stages and the first latching stage, the phase inversion occurring in the comparison stages is also compensated for.

Such a comparator may therefore be constructed by means of depletion-type gallium-arsenide field-effect transistors.

Embodiments of the invention will now be described in more detail, by way of example, with reference to the accompanying drawings, in which.

Figure 1:
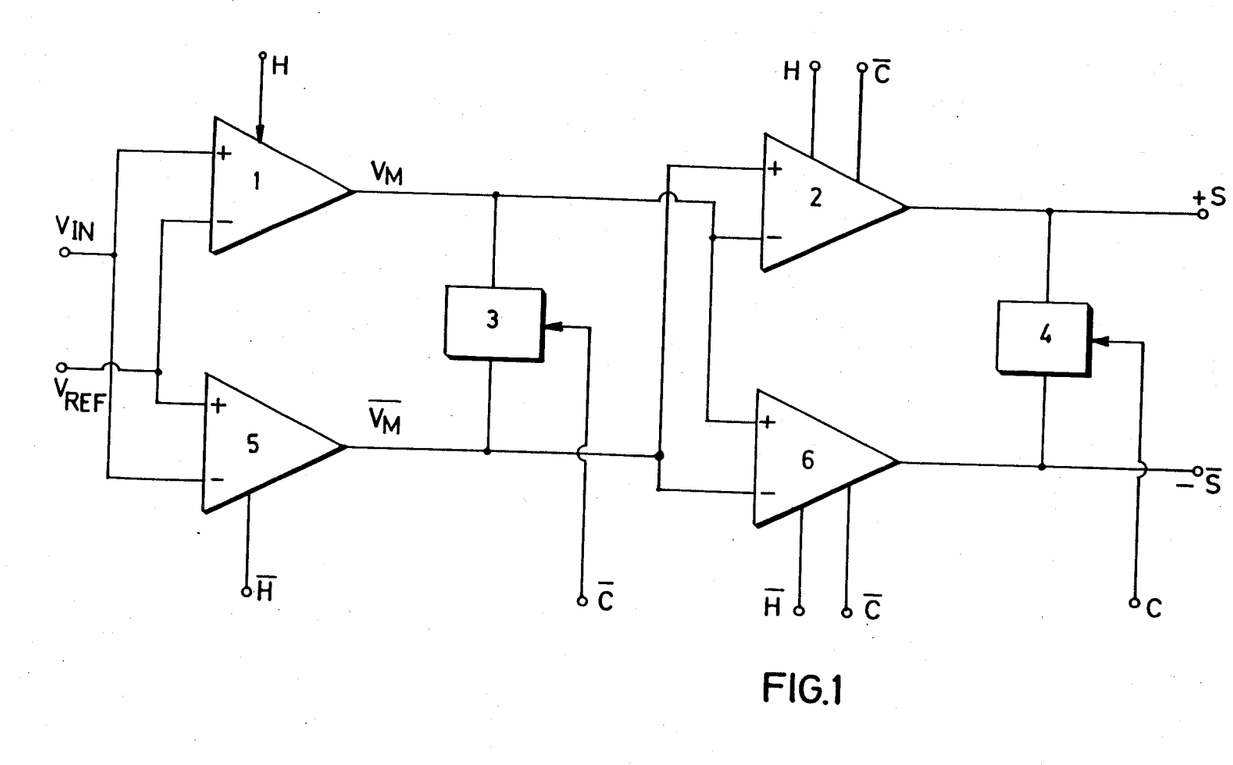
FIG. 1 is a block diagram of the circuit in accordance with the invention.

As is shown in FIG. 1 the clocked comparator in accordance with the invention comprises two comparison stages 1 and 5 coupled to a first latching stage 3. Each comparison stage receives an analog input signal $V_{IN}$ and an analog reference signal $V_{REF}$ and their coupled outputs supply an intermediated signal $V_M$ and its complement $\overline{V_M}$.

The comparator further comprises two amplifier stages 2 and 6 coupled to a second latching stage 4. Each amplifier stage receives the intermediate signals $V_M$ and $\overline{V_M}$ and their coupled outputs supply an amplified digital signal which is in phase with the value of the difference between the input signal $V_{IN}$ and the reference signal $V_{REF}$.

The first latching stage 3 and the second latching stage 4 are alternately enabled by the complementary clock signal $\overline{C}$ and by the clock signal C.

The first comparison stage 1 and the second comparison stage 5 are alternately enabled by a second clock signal H and its complement $\overline{H}$.

The first amplifier stage 2 and the second amplifier stage 6 are enabled alternately at the same time as the second comparison stage and the first comparison stage by the second clock signals H and $\overline{H}$ and at the same time as the first latching stage by the complement $\overline{C}$ of the first clock signal.

Figure 2:
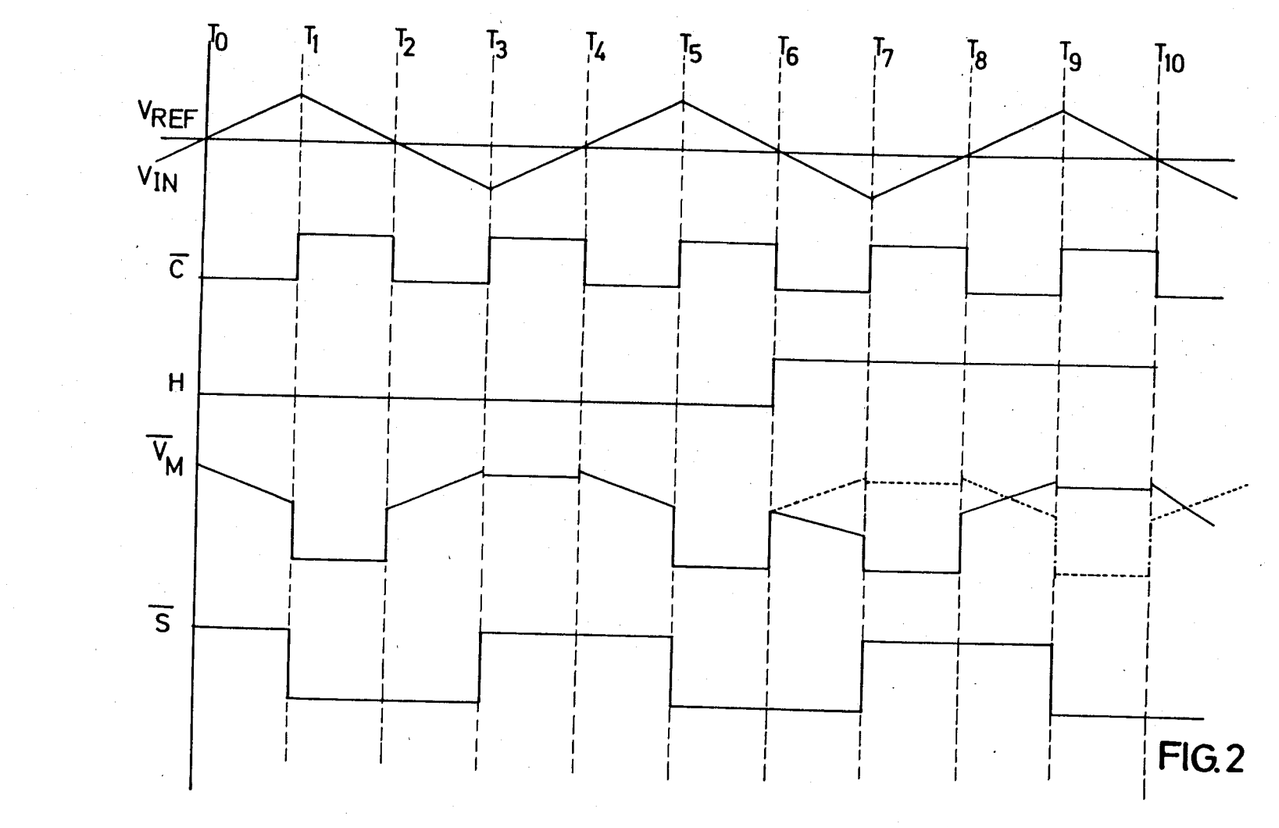
FIG. 2 shows the signal waveforms in the various parts of the circuit as a function of the clock signals.

Thus, as is shown in FIG. 2, when the difference between the analog input signal $V_{IN}$ and the analog reference signal $V_{REF}$ applied to the first comparison stage is positive and when the rising edge of the complement $\overline{C}$ of the first clock signal, which triggers the first latching stage, appears, the complement $\overline{V_M}$ of the intermediate signal goes low. Similarly, when the difference is negative the signal $\overline{V_M}$ goes high.

The first amplifier stage amplifies the logic states of the intermediate signal $V_M$ and maintains these states during the period of the first clock signal C which controls the second latching stage and supplies a digital binary output signal $\overline{S}$ which follows the inverse of the sign of the difference between the analog input signals.

However, the second comparison stage is enabled periodically by the clock signal H in order to eliminate the hysteresis effect.

The correct phase of the intermediate signal is then inverted, which is undesirable. In order to restore the correct phase of the output signal, there is provided a second amplifier stage operated alternately with the first amplifier stage with the same period as the comparison stages.

As is shown in FIG. 2, the intermediate signal $\overline{V_M}$ is inverted on the rising edge of the clock signal H. However, since the second amplifier stage is enabled simultaneously, the phase of output signal $\overline{S}$ is nevertheless in conformity with the sign of the difference between the input signals.

The signal waveforms obtained if there would be only one comparison stage and one amplifier stage and in the absence of the second clock signal are shown in broken lines. The signal waveforms obtained in the circuit in accordance with the invention are shown in solid lines.

In one embodiment the comparator in accordance with the invention suitably comprises depletion-type gallium-arsenide field-effect transistors, although these exhibit hysteresis.

This effect is caused by charges stored in the gallium-arsenide traps of the transistors forming the comparison stage. It becomes more pronounced as the time between two consecutive rising and falling edges in the input voltage decreases relative to the time constants of the traps.

As a result of its high electron mobility gallium-arsenide enables very fast circuits to be realised. The present invention ensures that this last-mentioned advantage is not lost.

The presence of two comparison stages enables the voltage to be encoded and the reference voltage to be cyclically permuted with a frequency which is high relative to the time constant of the traps. The traps are then charged to a neutral level and the hysteresis effect is cancelled.

In the present embodiment of the invention the comparator therefore comprises Schottky-gate field-effect transistors of the depletion type, i.e. whose cut-off voltage $V_T<0$ is such that they are normally conductive in the absence of a signal.

Figure 3:
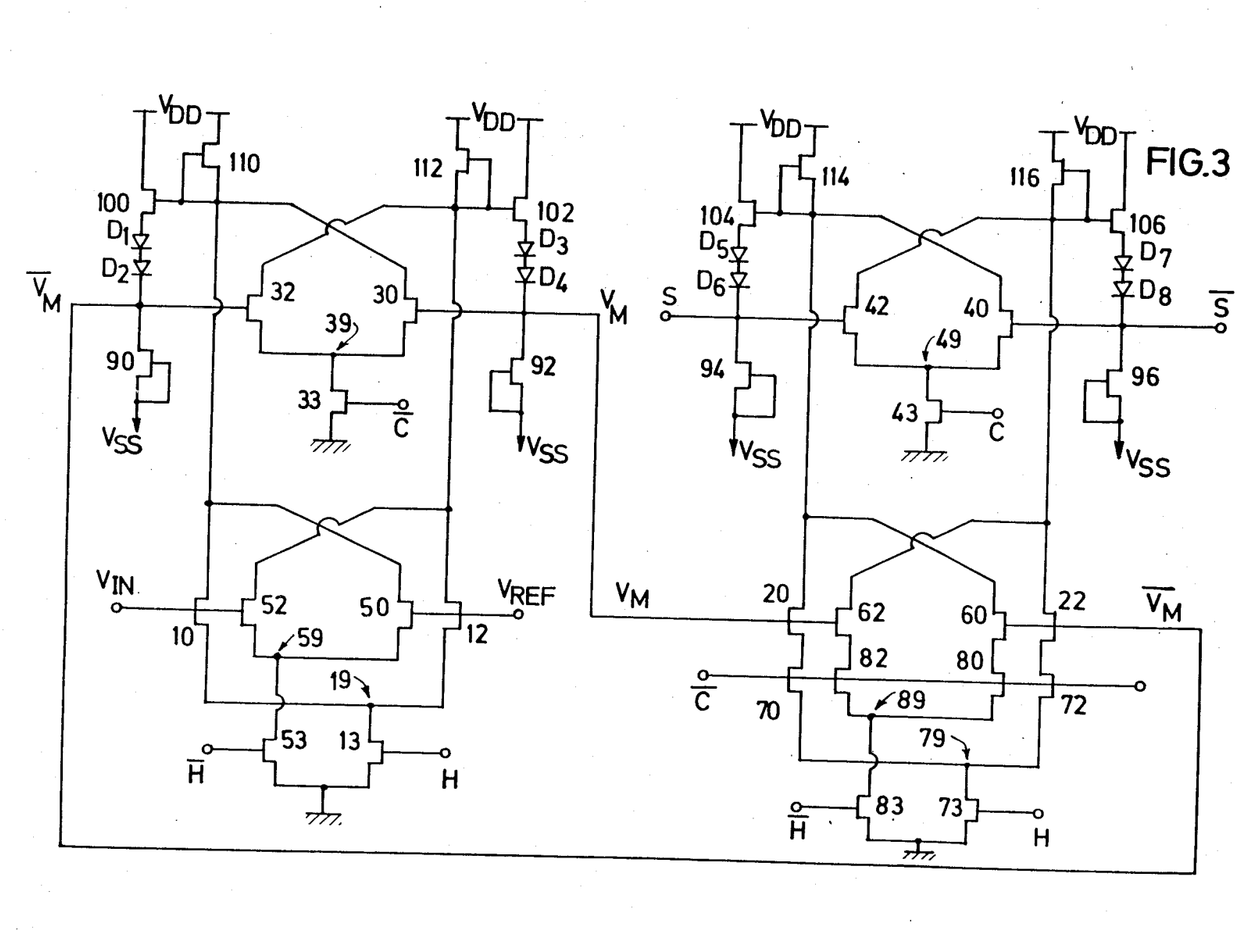
FIG. 3 shows a circuit in accordance with the invention utilising BFL logic with depletion-type field-effect transistors.

As shown in FIG. 3, the first comparison stage comprises two transistors 10 and 12, whose sources are commoned and whose gates receive the analog input voltage $V_{IN}$ and the analog reference voltage $V_{REF}$ respectively. The commoned sources connected to the terminal 19 are, for example, connected to ground via a current-source transistor 13 which is controlled by the clock signal H.

The second comparison stage comprises two transistors 52 and 50, whose sources are commoned and whose gates receive the input voltage $V_{IN}$ and the reference voltage $V_{REF}$ respectively. The commoned sources connected to the terminal 59 are connected to ground via a current-source transistor 53 which is controlled by the complement $\overline{H}$ of the clock signal H. The respective drains of the transistors 50 and 52 are cross-coupled to the drains of transistors 10 and 12.

The drains of the transistors 10 and 50 are connected to a first direct-voltage supply $V_{DD}$ via a load transistor 110 and the drains of the transistors 52 and 12 are connected to the direct-voltage supply $V_{DD}$ via a load transistor 112.

The first latching stage comprises two transistors 32 and 30, whose sources are commoned to the terminal 39. This terminal is connected to gound potential via a current-source transistor 33, which is controlled by the complementary clock signal $\overline{C}$. The drains of the transistors 30 and 32 are cross-coupled to the respective drains of the transistors of the comparison stages and supply the intermediate signals $\overline{V_M}$ and $V_M$.

The first amplifier stage comprises two transistors 20 and 22 whose source are connected to the same potential via the transistors 70 and 72 respectively which are controlled by the complementary clock signal $\overline{C}$. The gates of the transistors 20 and 22 receive the intermediate signal $V_M$ and its complement $\overline{V_M}$ respectively. The transistors 70 and 72, which function as switches, have their sources coupled to the terminal 79. This point is connected to ground via a current-source transistor 73 controlled by the clock signal H.

The second amplifier stage comprises two transistors 62 and 60 whose sources are connected to the same potential via the respective transistor 82 and 80 controlled by the complementary clock signal $\overline{C}$. The gates of the transistors 62 and 60 receive the intermediate signal $V_M$ and its complement $\overline{V_M}$ respectively. The transistors 82 and 80, which function as switches, have their sources coupled to the terminal 89. This point is connected to ground via a current-source transistor 83 which is controlled by the complementary clock signal $\overline{H}$.

The drains of the transistors 60 and 62 are cross-coupled to the drains of the transistors 20 and 22. The switching-transistor pairs 70, 72 and 80, 82 may each be replaced by a single transistor. However, in that case the transistor pairs 20, 22 and 62, 60 would have their sources commoned, forming a current path when $\overline{C}$ would be low. The signals processed in this part of the circuit are logic signals and therefore have such an amplitude that they could take this path, which is undesirable.

The second latching stage comprises two transistors 42 and 40 having their sources commoned to the terminal 49. This terminal is connected to ground potential via a current-source transistor 43 which is controlled by the clock signal C. The drains of the transistor 40 and 42 are cross-coupled to the respective drains of the transistors of the amplifier stages and supply the comparator output signals S and $\overline{S}$.

Since the transistors used in the circuit arrangement are of the depletion type, i.e. the transistors may have a threshold voltage $V_T<0$, the output signal of the comparator is not directly suitable for use in a logic circuit. In order to obtain the required voltage level it is necessary to utilize a level-shifting circuit. Such a level-shifting circuit is referred to as Buffered Fet Logic (BFL). It comprises a first follower transistor, which is connected in common drain arrangement and which has its gate connected to the output of the latching stage. The source electrode of this follower transistor is connected to the drain of a current-source transistor via 1 to 3 diodes depending on the desired level shift. The drain of this current-source transistor constitutes the output of the circuit. Thus, the drains of the transistors 30 and 32 are connected via the gates of the follower transistor of a level-shifting circuit. For the transistor 30 this level-shifting circuit comprises the follower transistor 100, two diodes $D_1$ and $D_2$ and the current-source transistor 90, and for the transistor 32 it comprises the follower transistor 102, the diodes $D_3$ and $D_4$, and the current-source transistor 92. The intermediate signal $V_M$ and its complement $\overline{V_M}$ therefore appear on the drain of the transistor 92 and on the drain of the transistor 90 respectively of these level-shifting circuits.

Similarly, the drains of the transistors 40 and 42 are connected to the gate of the follower transistor of a level-shifting circuit via the short-circuited gate and source electrodes of the transistors 114 and 116. For the transistor 40 this level-shifting circuit comprises the follower transistor 104, two diodes $D_5$ and $D_6$ and the current-source transistor 94 and for the transistor 42 it comprises the follower transistor 106, the diodes $D_7$ and $D_8$ and the current-source transistor 96. The output signal S and the complementary output signal $\overline{S}$ of the comparator therefore appear on the drain of the transistor 94 and on the drain of the transistor 96 respectively of these level-shifting circuits.

Figure 4:
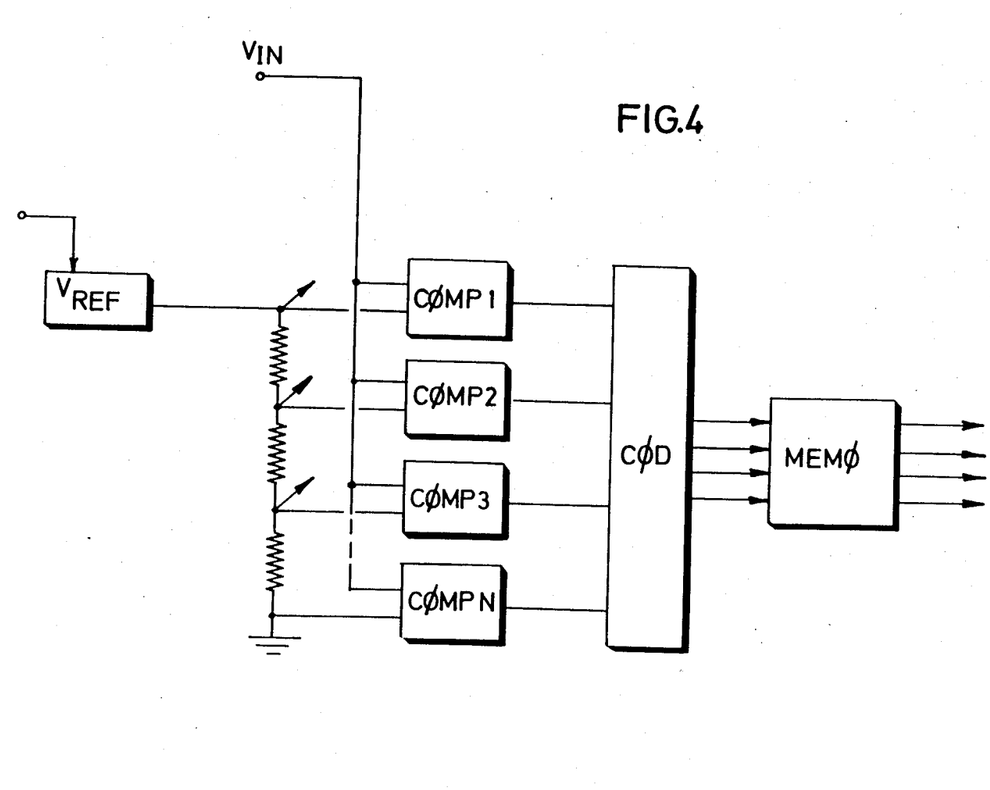
FIG. 4 shows an analog-to-digital converter circuit comprising comparators in accordance with the invention.

The analog-to-digital converter shown in FIG. 4 comprises a plurality of comparators (COMP 1 . . . COMP N) which are arranged in parallel and which each have two inputs. The analog input voltage $V_{IN}$ to be converted is applied to an input of each comparator. The other input of each comparator receives a reference voltage obtained by applying a reference voltage across a series arrangement of a plurality of resistors. If all these resistors are equal a geometrical progression of reference voltages is obtained, the ratios between the reference voltages being $V_{RED/2}$. The various reference voltages, having sequence numbers $1, 2, \ldots 2^{n-1}, 2^n$, thus constitute a series $V_{REF/2}n, V_{REF/2}n\text{-}1, \ldots V_{REF}N$, the latter voltages being used only for indicating an overload bit. The outputs of the comparators are connected to the inputs of a logic encoding device (COD) which delivers an n-bit digital output signal in conformity with an arbitrary code, which may be for example the Gray code. The encoding device should be constructed in conformity with the required code, but will not be described here because the encoding device falls beyond the scope of the present invention. The output of the encoding device may be connected to a memory (MEMO) in order to preserve the information from the encoding device for at least a part of the clock period to allow the comparators to be synchronized. The clock signal required for the comparator and the latches is supplied by an external circuit. These circuits may be integrated on the same semiconductor substrate.

In the present example the voltages $V_{IN}$, $V_{REF}$, $V_M$, $\overline{V_M}$, S and $\overline{S}$ are 0 V for the high level and $-2$ V for the low level.

The threshold voltages of the transistors are $V_T = -2$ V.

The d.c. supply voltages are:
the first supply voltage $V_{DD} = -4$ V
the second supply voltage, ground potential $= 0$ V
the third supply voltage $V_{SS} = -3$ V, which is the voltage at the sources of the current-source transistors of the level shifting stages.

The transistors and the diodes are of the Schottky type, their gate widths being specified in the following Table 1:

TABLE 1

| | L = 15 μm | L = 10 μm |
|---|---|---|
| Transistor no. | 13, 53, 33 | 110, 112, 114, 116 |
| | 83, 73, 43 | 100, 102, 104, 106 |
| | 10, 12, 50, 52 | 90, 92, 94, 96 |
| | 70, 72, 80, 82 | $D_1, D_2, D_3, D_4$ |
| | 20, 22, 60, 62 | $D_5, D_6, D_7, D_8$ |
| | 30, 32, 40, 42 | |

The use of an identical comparator for the construction of an analog-to-digital converter is also advantageous if the arrangement is constructed as an integrated circuit.

It will be obvious that several variants are conceivable to those skilled in the art without departing from the scope of the present invention as defined in the appended claims.

What is claimed is:

1. A clocked voltage comparator formed by means of transistors which each have a control electrode, a first main electrode and a second main electrode, which comparator comprises:

a comparison stage for comparing an analog input voltage $V_{IN}$ with an analog reference voltage $V_{REF}$ and supplying the result of this comparison in the form of an intermediate signal $V_M$ and its complement $\overline{V_M}$, which stage comprises two transistors (10 and 12) connected as a first differential pair, the input voltage $V_{IN}$ and the reference voltage $V_{REF}$ being applied to the respective control electrodes of said transistors, whose first main electrodes are connected to a common terminal (19) for applying a bias current and whose second main electrodes are each coupled to a first direct voltage supply terminal $V_{DD}$ via a load (110, 112) and supply the intermediate signal $V_M$ and its complement $\overline{V_M}$ respectively;

an amplifier stage for amplifying the logic states of the intermediate signal, which stage comprises two transistors (20, 22) connected as a second differential pair, whose respective control electrodes receive said intermediate signal $V_M$ and its complement $\overline{V_M}$, whose first main electrodes receive a bias current and whose secured main electrodes are each coupled to the first d.c. supply terminal via a load (114, 116) and supply the digital output signal S of the comparator and its complement $\overline{S}$;

a first latching stage and a second latching stage coupled to the comparison stage and the amplifier stage respectively, for generating and latching logic states in conformity with the output signals from the comparison stage and the amplifier stage, which first latching stage comprises two transistors (30 and 32) arranged as a third differential pair forming a bistable latch, the intermediate signal $V_M$ and its complement $\overline{V_M}$ being applied to the respective control electrodes of said first latching-stage transistors, whose first main electrodes are connected to a common terminal (39) for applying a bias current and whose second main electrodes are cross-coupled to the second main electrodes of the transistors of the comparison stage, and which second latching stage comprises two transistors (40 and 42) arranged as a fourth differential pair forming a bistable latch, the digital output signal S from the amplifier stage and its complement $\overline{S}$ being applied to the respective control electrodes of said second latching-stage transistors, whose first main electrodes are connected to a common terminal (49) for applying a bias current and whose second main electrodes are cross-coupled to the second main electrodes of the transistors of the amplifier stage, characterized in that it also comprises:

a second comparison stage adapted to provide compensation for the hysteresis of the first comparison stage, which second comparison stage comprises two transistors (52 and 50) arranged as a fifth differential pair, the input voltage and the reference voltage being applied to the respective control electrodes of said transistors, whose first main electrodes are connected to a common terminal (59) for applying a bias voltage and whose second main electrodes are cross-coupled to the second main electrodes of the transistors of the first comparison stage, a second amplifier stage adapted to eliminate the phase indeterminacy of the logic states of the intermediate signal, which second amplifier stage comprises two transistors (62 and 60) arranged as a sixth differential pair, the intermediate signal and its complement being applied to the respective control electrodes of said transistors, whose first main electrodes serve for applying a bias current and whose second main electrodes are cross-coupled to the second main electrodes of the transistors of the first amplifier stage, in that the bias currents for the first differential pair and the fifth differential pair are such that the first comparison stage and the second comparison stage operate alternately, in that the bias currents for the second differential pair and the sixth differential pair are such that the first amplifier stage and the second amplifier stage operate alternately, in that the bias currents for the third differential pair and the fourth differential pair are such that the first latching stage and the second latching stage operate alternately, and in that the bias currents for the amplifier stages operate said amplifier stages in phase with the comparison stages and with the first latching stage.

2. A comparator as claimed in claim 1, characterized in that the bias currents to the various stages are such that:

the common point (49) of the fourth differential pair is coupled to a second direct-voltage supply terminal via a current-source transistor (43) which is controlled by a first clock signal C, and in that the common terminal (39) of the third differential pair is coupled to the second direct-voltage supply terminal via a current-source transistor (33) which is controlled by the complement ($\overline{C}$) of the first clock signal, in such a way that the first latching stage and the second latching stage are enabled alternately;

the common terminal (19) of the first differential pair is coupled to the second direct-voltage supply terminal via a current-source transistor (13) which is controlled by a second clock signal H, and in that the common terminal (59) of the fifth differential pair is coupled to the second direct-voltage supply terminal via a current-source transistor (53) which is controlled by the complement $\overline{H}$ of the second clock signal in such a way that the first comparison stage and the second comparison stage are enabled alternately;

the first main electrodes of the two transistors (20, 22) of the second differential pair are coupled to respective second main electrodes of two transistors (70, 72) forming a seventh differential pair, whose central electrodes receive the complement $\overline{C}$ of the first clock signal and whose first main electrodes are connected to a common terminal (79) which is coupled to the second direct-voltage supply terminal via a current-source transistor (73) which is controlled by the clock signal H;

the first main electrodes of the two transistors (62, 60) of the sixth differential pair are coupled to the respective second main electrodes of two transistors (82, 80) forming an eighth differential pair, whose control electrodes receive the complement $\overline{C}$ of the first clock signal and whose first main electrodes are connected to a common terminal (89) which is coupled to the second direct-voltage supply terminal via a current-source transistor (83) which is controlled by the complement $\overline{H}$ of the second clock signal, in such a way that the first amplifier stage and the second amplifier stage are enabled alternately and in phase with the comparison stages on the one hand and the first latching stage on the other hand.

3. A comparator as claimed in claim 1, characterized in that the transistors of the comparison stages and the amplifier stages are loaded by respective load transistors each having a control electrode, a first main electrode and a second main electrode, each control electrode being connected to its first main electrode which in turn is coupled to the second main electrode of the corresponding transistors of the differential pairs of the comparison and amplifier stages, and wherein the second main electrodes of the load transistors are connected to the first direct-voltage supply terminal.

4. A comparator as claimed in claim 3, characterized in that each load also comprises a level-shifting circuit comprising a transistor having a control electrode, a first main electrode and a second main electrode, which control electrode is coupled to the control electrode of the load transistor, which second main electrode is coupled to the first direct-voltage supply terminal and which first main electrode is coupled to the output and to a current source via a series arrangement of a plurality of diodes of the level-shifting circuit.

5. A comparator as claimed in claim 4, characterized in that the current source comprises a transistor having a control electrode, a first main electrode and a second main electrode, which control electrode and first main electrode are connected to a d.c. supply terminal ($V_{SS}$).

6. A comparator as claimed in claim 1, characterized in that the transistors of the circuit are Schottky field-effect transistors of the depletion type.

7. An analog-to-digital converter, characterized in that for generating an n-bit digital output signal the analog-to-digital converter comprises $2^n$ parallel-connected clocked comparators as claimed in claim 1, and in that the analog input signal to be converted is applied to one input of each comparator and a different reference voltage is applied to the other input of each comparator, the outputs of the comparators being connected to an encoding device having an output at which the n-bit digital output signal appears.

8. A comparator as claimed in claim 2 wherein the transistors of the comparison stages and the amplifier stages are loaded by respective load transistors each having a control electrode, a first main electrode and a second main electrode, each control electrode being connected to its first main electrode which in turn is coupled to the second main electrode of the corresponding transistors of the differential pairs of the comparison and amplifier stages, and wherein the second main electrodes of the load transistors are connected to the first direct-voltage supply terminal.

9. A comparator as claimed in claim 8 wherein each load further comprises a level-shifting circuit comprising a transistor having a control electrode, a first main electrode and a second main electrode with each control electrode coupled to a respective control electrode of a respective load transistor, with each second main electrode coupled to the first direct voltage supply terminal and each first main electrode coupled to the output and to a current source via a series arrangement of a plurality of diodes of the level-shifting circuit.

* * * * *

UNITED STATES PATENT AND TRADEMARK OFFICE
CERTIFICATE OF CORRECTION

PATENT NO. : 4.656.371
DATED      : April 7. 1987
INVENTOR(S) : Michel J.M. Binet , et al It is certified that error appears in the above-identified patent and that said Letters Patent is hereby corrected as shown below:

IN THE CLAIMS

Claim 1 , line 26     change "secured" to --second--

Claim 2 , line 30     change "central" to --control--

Signed and Sealed this

Eighteenth Day of October, 1988

*Attest:*

DONALD J. QUIGG

*Attesting Officer*     *Commissioner of Patents and Trademarks*